(12) United States Patent
Kang et al.

(10) Patent No.: US 11,911,911 B2
(45) Date of Patent: Feb. 27, 2024

(54) NEAR-SITE ROBOTIC CONSTRUCTION SYSTEM AND METHOD FOR PREFABRICATIONS OF CONSTRUCTION COMPONENTS

(71) Applicant: SMART BUILDING TECH CO., LTD., Taipei (TW)

(72) Inventors: Shih-Chung Kang, Taipei (TW); Liang-Ting Tsai, Taipei (TW); Cheng-Hsuan Yang, Taipei (TW)

(73) Assignee: SMART BUILDING TECH CO., LTD., Taipei (TW)

( * ) Notice: Subject to any disclaimer, the term of this patent is extended or adjusted under 35 U.S.C. 154(b) by 232 days.

(21) Appl. No.: 17/218,444

(22) Filed: Mar. 31, 2021

(65) Prior Publication Data
US 2021/0316457 A1   Oct. 14, 2021

Related U.S. Application Data
(60) Provisional application No. 63/007,143, filed on Apr. 8, 2020.

(51) Int. Cl.
| | |
|---|---|
| *B25J 9/16* | (2006.01) |
| *G06F 30/13* | (2020.01) |
| *G06F 30/12* | (2020.01) |

(52) U.S. Cl.
CPC ............ *B25J 9/1671* (2013.01); *B25J 9/162* (2013.01); *B25J 9/1661* (2013.01); *B25J 9/1664* (2013.01); *G06F 30/12* (2020.01); *G06F 30/13* (2020.01)

(58) Field of Classification Search
CPC ........ B25J 9/1671; B25J 9/162; B25J 9/1661; B25J 9/1664; B25J 9/1669; G06F 30/12;
(Continued)

(56) References Cited

U.S. PATENT DOCUMENTS

| | | | |
|---|---|---|---|
| 10,920,434 B1* | 2/2021 | Pearson, Jr. | ......... B65G 47/904 |
| 2016/0136815 A1* | 5/2016 | Linnell | .................. B25J 9/1676 |
| | | | 700/255 |

(Continued)

OTHER PUBLICATIONS

Sven Stumm, Peter Neu and Sigrid Brell-Cokcan, "Towards Cloud Informed Robotics", pp. 59-64 (2017 Proceedings of the 34rd ISARC, Taipei, Taiwan, ISBN 978-80-263-1371-7, ISSN 2413-5844) (Year: 2017).*

(Continued)

*Primary Examiner* — Adam R Mott
*Assistant Examiner* — Matthew C Gammon
(74) *Attorney, Agent, or Firm* — Jackson IPG PLLC; Demian K. Jackson

(57) ABSTRACT

The present invention relates to a near-site robotic construction system. The system includes a work station situated on a near-site position in a close proximity to a building foundation on which a building is under construction and providing shelter and workspace for at least one robot to work; and a computer-assisted cloud based near-site robotic construction platform installed on a cloud server system and configured to provide for a user to operate through a web browser, import and extract a building information modelling data, and plan a predetermined motion command set partly based on the extracted building information modelling data, wherein the at least one robot is configured to work in accordance with the predetermined motion command set to prefabricate a plurality of components for the building in the work station on the near-site position.

8 Claims, 6 Drawing Sheets

(58) Field of Classification Search
CPC .......... G06F 30/13; G05B 2219/45064; G05B 2219/45086; G05B 2219/45211
See application file for complete search history.

(56) References Cited

U.S. PATENT DOCUMENTS

2016/0263767 A1* 9/2016 Williams ................ B27F 7/003
2020/0134745 A1* 4/2020 McLinden ....... G06Q 10/06313

OTHER PUBLICATIONS

Nicolas Mangon, "This Robot-Filled Shipping Container Is Bringing Manufacturing to the Construction Site." Autodesk News, Autodesk, Jan. 25, 2019, https://adsknews.autodesk.com/alternative-post/robot-shipping-container-bringing-manufacturing-technology-construction-site (Year: 2019).*

* cited by examiner

NEAR-SITE ROBOTIC CONSTRUCTION SYSTEM AND METHOD FOR PREFABRICATIONS OF CONSTRUCTION COMPONENTS

CROSS-REFERENCE TO RELATED APPLICATION

This application is based upon and claims the benefit of priority to U.S. Provisional Application No. U.S. 63/007,143, filed on Apr. 8, 2020, the entire disclosure of which is incorporated herein by reference.

COPYRIGHT NOTICE

A portion of the disclosure including at least descriptions, embodiments, claims, and drawings of this patent document contains materials that are subject to copyright protection. The copyright owner has no objection to the reproduction of the patent document or the patent disclosure, as it appears in the U.S. Patent and Trademark Office patent file or records, but otherwise reserves all copyright rights whatsoever.

FIELD

The present invention relates to a near-site robotic construction system and method, in particular to a near-site robotic construction system and method that transfers a building information modelling design into an actual robotic prefabrication task that is planned, scheduled, simulated and proven with the constructability by a computer-assisted cloud based platform operated by a user to actually prefabricate basic construction components at a near-site position that is in a close proximity to a construction base.

BACKGROUND

In the field of civil engineering, the building construction process for building private properties, such as houses, homes, and offices, and public structures, such as bridges, highways, and hospitals, has an ancient heritage. Through the centuries of development, currently there are several major construction methods available. The first-type construction method is the on-site construction method, which means that everything, including construction components and building, is built on the construction site. Although the on-site construction method has been widely accepted and commonly used throughout the world for centuries, it has many defects including being very costly, time-consuming, labor-intensive, low productivity, etc.

Therefore, the second-type construction method, which is classified as the off-site construction method, is emerging and being reduced to practice. Modular homes and precast concrete are the most commonly used off-site construction methods. The precast concrete method is applied to the construction of public infrastructure. Almost all of the large pieces of required basic components, such as reinforced concrete walls, and columns, are pre-casted by pre-casting concrete in a reusable mold by using large-scale equipment installed in a pre-casting factory, which is usually far away from the construction site. The pre-made components are transported to the construction site by heavyweight vehicles. Usually the off-site method is considered to be able to improve the overall efficiency by an average of 20% to 25% in all aspects of construction cost, speed, and labor demands.

The third-type construction method is the robotics off-site construction and classified as the off-site construction method as well. The programmed sophisticated industrial robots replace large-scale facilities to be installed in a professional off-site factory, to prefabricate and assemble construction components. Averagely, the off-site robotics construction method further reduces overall construction cost and increase productivity, as compared to the pre-casting method.

However, for the off-site construction methods, certain obvious defects are raised. For instances, the standardized production lines reduce the versatility of building designs, and the logistics and shipping costs become significant and dominant. In particular, the off-site robotics construction method, a huge investment is needed to train engineers, contractors, and users to control and program the robots or robot arms. Users also need to spend lots of time on looping the processes of continuous testing, re-planning, re-designing, etc. In addition, the conventional robotic and automation field is used to focus on solutions for general purpose solutions or construction robotics for specific tasks.

Hence, there is a need to solve the above deficiencies/issues.

SUMMARY

In view of the state of the art, the present invention provides a near-site robotic construction system and method that transfers a building information modelling design into an actual robotic prefabrication task that is planned, scheduled, simulated and proven with the constructability by a computer-assisted cloud based platform operated by a user to actually prefabricate basic construction components on a near-site position that is in a close proximity to a construction base.

Accordingly, the present invention provides a near-site robotic construction system. The system includes a work station situated on a near-site position in a close proximity to a building foundation on which a building is under construction and providing shelter and workspace for at least one robot to work; and a computer-assisted cloud based near-site robotic construction platform installed on a cloud server system and configured to provide for a user to operate through a web browser, import and extract a building information modelling data, and plan a predetermined motion command set partly based on the extracted building information modelling data, wherein the at least one robot is configured to work in accordance with the predetermined motion command set to prefabricate a plurality of components for the building in the work station on the near-site position.

The present invention further provides a near-site robotic construction system. The system includes a mobile work station containing and carrying at least one robot to a near-site position in a close proximity to a construction base where a building is under construction; and a computer-assisted cloud based near-site robotic construction platform configured to provide for a user to operate through a web browser, import and extract a building information modelling data, and plan a predetermined motion command set partly based on the extracted building information modelling data, wherein the at least one robot is configured to work in accordance with the predetermined motion command set to prefabricate a plurality of components for the building in the mobile work station on the near-site position.

The present invention further provides a near-site robotic construction method. The method includes setting up a work station on a near-site position where is in a close proximity to a construction site on which a building is under construction, in which the work station provides shelter and workspace for at least one robot to work; providing a computer-assisted cloud based near-site robotic construction platform installed on a cloud server system for a user to operate through a web browser; by operating the computer-assisted cloud based near-site robotic construction platform through the web browser, to import and extract a building information modelling data, and plan a predetermined motion command set partly based on the extracted building information modelling data; and configuring the at least one robot to work in accordance with the predetermined motion command set to prefabricate a plurality of components for the building in the work station on the near-site position.

The above content described in the summary is intended to provide a simplified summary for the presently disclosed invention, so that readers are able to have an initial and basic understanding to the presently disclosed invention. The above content is not aimed to reveal or disclose a comprehensive and detailed description for the present invention, and is never intended to indicate essential elements in various embodiments in the present invention, or define the scope or coverage in the present invention.

DESCRIPTION OF THE DRAWINGS

A more complete appreciation of the invention and many of the attendant advantages thereof are readily obtained as the same become better understood by reference to the following detailed description when considered in connection with the accompanying drawing, wherein.

DETAILED DESCRIPTION

Figure 1:
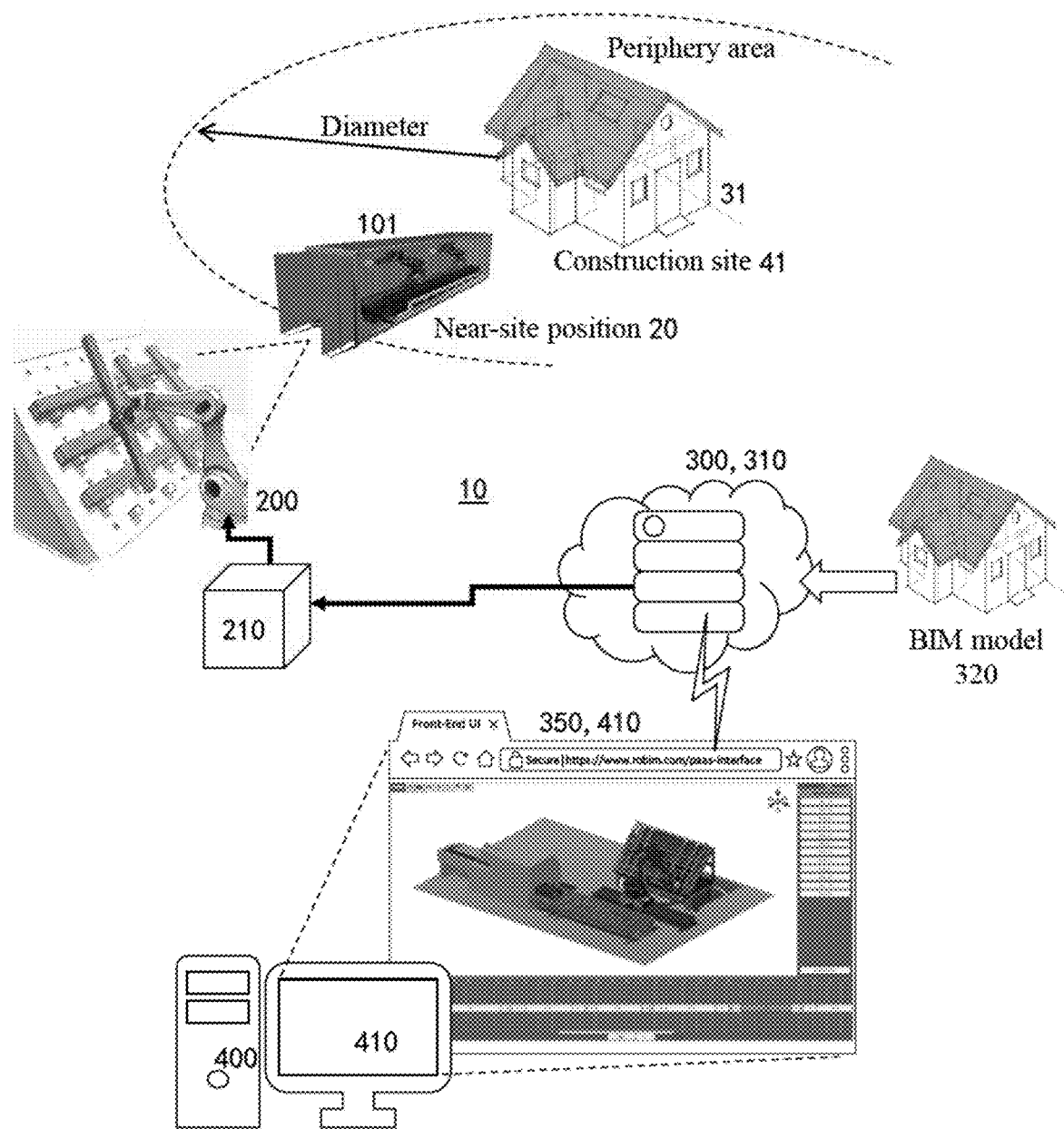
FIG. 1 is a schematic view illustrating a system architecture, as well as the first embodiment for a near-site robotic construction system in accordance with the present invention.

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

It is to be noticed that the term "including", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device including means A and B" should not be limited to devices consisting only of components A and B.

The disclosure will now be described by a detailed description of several embodiments. It is clear that other embodiments can be configured according to the knowledge of persons skilled in the art without departing from the true technical teaching of the present disclosure, the claimed disclosure being limited only by the terms of the appended claims.

The terms "robot", "robots" and the like refer to any automatically operated mechanical machine which is programmed to perform a wide variety of functions, operations, duties or tasks automatically, may not resemble human beings in appearance or perform in a humanlike manner, and have different scalable formations varied from a lightweight manufacturing robots to a heavy-load or heavy-duty assembly robots. In certain embodiments of the disclosure, the robot is preferably an industrial robot or a multi-axis robot arm, and may be regarded as a robot builder.

The term "building" means any form of building, such as a house, a wooden house, a reinforced concrete building, a steel building, a steel-reinforced concrete building, a residential complex, an apartment complex, a condominium, a dwelling unit, or a skyscraper, which is built by implementing civil engineering means or civil engineering based construction works.

The terms "construction base" and "building foundation" refer to a site, a place, an area, a location, a spot, a position, a base or a venue on which a building is under construction. The term "construction site" refers to a site, a place, an area, a location, a spot, a position, a base or a venue where construction works are carried out.

The terms "near-site position", "near site" and the like mean a site, a place, an area, a location, a spot, a position, a base or a venue situated near, in a close proximity to, close to, or next to the construction site, the construction base, or the building foundation preferably less than 50 meters, 100 meters, 150 meters, 300 meters or 500 meters, as well as the terms "near-site position", "near site" and the like mean a site, a place, an area, a location, a spot, a position, a base or a venue situated within a periphery or a peripheral area around the construction site and has a diameter preferably less than 50 meters, 100 meters, 150 meters, 300 meters or 500 meters.

The terms "work station", "work cell", "work unit" and the like refer to a place or a manufacturing environment preferably situated close to or next to the construction site as near or close as possible and capable of providing shelter and working space for the installation of robots to work, operate, or perform tasks.

The term "mobile work station" refers to a mechanical device capable of containing and carrying at least one robot or preferably multiple robots and providing shelter and working space for robots to work, operate, or perform tasks, wherein the device has its own power to move, is equipped with an electric motor or fuel engine to move, or has no its own mobility but is towed or driven by other externally powered vehicles. The embodiments of the mobile work station include, but are not limited to, a container, a container truck, a cargo truck, a container installed on or carried by a mobile wheeled or tracked chassis and towed by a truck, a pickup truck, or a trailer. The mobile work station is better to have features of high mobility to carry robots to any pre-determined near-site position and rapid deployment to rapidly deploy robots at the near-site position to engage in prefabrication construction works.

FIG. 1 is a schematic view illustrating a system architecture, as well as the first embodiment for a near-site robotic construction system in accordance with the present invention. FIG. 1 demonstrates an example of a near-site robotic construction system 10 which may be a part of a construction system used to build or construct one or more buildings. The near-site robotic construction system 10 includes a mobile work station 101 that contains and carries multiple robots 200 and is intended to be located at a near-site position 20 close to a construction site 41 where a building 31 is under construction. The mobile work station 101 is used to provide shelter and sufficient working space for the multiple robots 200.

The near-site robotic construction system 10 further includes a computer-assisted cloud based near-site robotic construction platform 300 (hereinafter referred to as the cloud based platform for short), which is established on the basis of SAAS (software as a service) and PAAS (platform as a service) cloud computing technologies and installed on a cloud computing server system 310 at a remote end. The cloud computing server system 310 may be a cluster of cloud-based computation servers and complex robotic motion calculations are conducted via cloud-based computational power. The cloud based platform 300 can automatically schedule, plan, and simulate optimal and collision-free paths for the robots 200 to follow to work accordingly, which is an easy-to-use robotic programming tool, provides a simulation-to-real (sim-to-real) environment for contractors, designers, and engineers to coordinate, schedule, plan, design, re-plan, re-design, simulate, or modify robotic component prefabrication tasks easily, and is also regarded as a construction planner.

The cloud based platform 300 is designed to provide and generate multiple dedicated user interfaces 350 including but not limited to an animation based user interface, a visualization user interface, a graphic based user interface, an interactive based user interface, a visual programming interface, an animation-based programming interface, and a hybrid user interface thereof, for display on a web browser. The multiple dedicated user interfaces 350 are available and operable to a user by simply opening and operating the web browser 410, a front-end user interface, on the own user equipment 400. In particular, the cloud based platform 300 provides the animation-based programming interface that allows the user to program the robot motions without learning and typing a single line of code. Most users with an appropriate engineering background can learn and control the basic robot operations within an hour.

The cloud based platform 300 is configured to import building information modelling (BIM) model 320 and to transform the building design in the BIM model 320 into actual robot motions to prefabricate essential basic components. The cloud based platform 300 includes a robotics simulator that allows the user, the designer, the engineer, and the manufacturer to plan, simulate, and control the industrial robots. The cloud based platform 300 provides a virtual design and validation environment for linking and integrating the BIM digital model with a robot's control system. Any user can simulate and control a robot with an animation-based tool instead of writing code. The cloud based platform 300 is a construction design toolset that actively assists any user in planning the robotic component prefabrication tasks easily and visually for a building under construction. The cloud based platform 300 links BIM design, robot motion planning results and robot control scripts through a cloud server.

A user equipment 400 refers to any electronic device that is capable of establishing upload and download communication links accessing an Internet and the cloud based platform 300, is installed with a web browser, executes the web browser, and provides the web browser for a user to use and operate. The user operates and accesses the cloud based platform 300 through operating multiple dedicated user interfaces shown in the web browser. The user equipment 400 are preferably selected from a personal computer, a notebook computer, a tablet device, a mobile device, and a smart phone. The user does not need to install any software but simply opens the web browser on the user equipment 400 to access and use the cloud based platform 300 which means that no complicated installation process is required.

Each of the multiple robots 200 have a robot controller 210 for receiving computer codes or instructions sent from the cloud based platform 300, and are configured and programmed to perform prefabrication tasks including fabrication of basic components or modules necessarily required to construct the building 31 at the near-site position 20, in accordance with the received codes or instructions.

Figure 2:
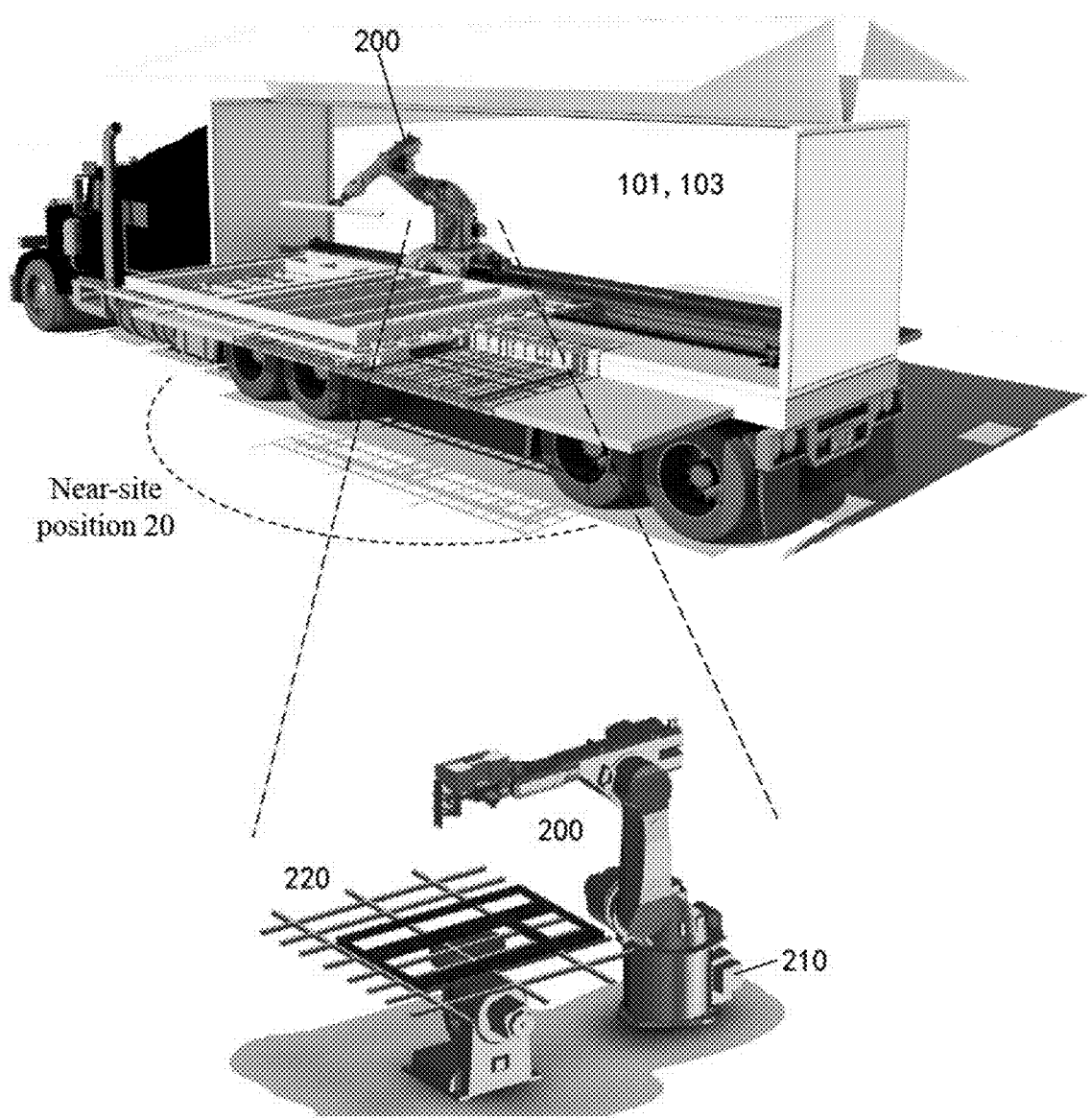
FIG. 2 is a schematic diagram illustrating the mobile work station and robots in the station in accordance with the present invention.

FIG. 2 is a schematic diagram illustrating the mobile work station and robots in the station in accordance with the present invention. In one embodiment, the mobile work station 101 is preferably a container 103 installed on and carried by a mobile wheeled chassis. The container 103 is towed and driven by a truck and is transported to the near-site position 20, and contains robot 200 and provides working space for robot 200 to fabricate different basic components, such as a wood frame 220, in the mobile work station 101 or in the container 103 on the near-site position 20. On the other hand, the robot 200 is shipped or transported to and deployed on the near-site position 20 by the container 103, the mobile work station 101. The robot 200, the robot builder, in the container 103 is enabled and activated and acts in accordance with the received codes or instructions from the cloud based platform 300 through the robot controller 210 to fabricate the wood frame 220.

Figure 3:
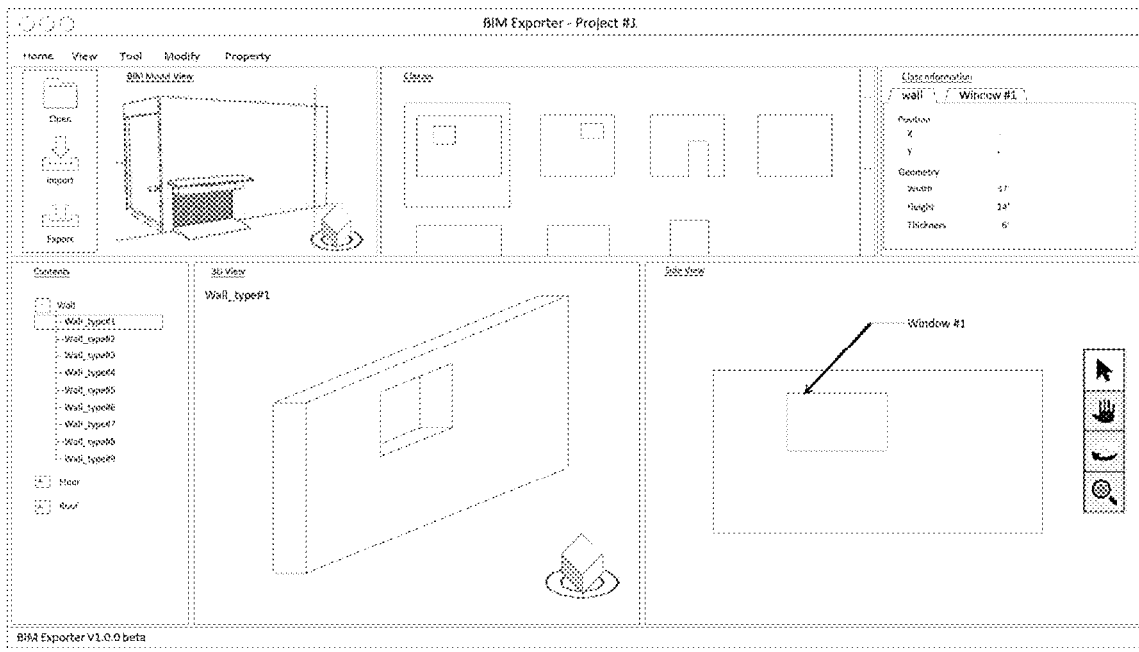
FIG. 3 is a schematic diagram illustrating a BIM data processing interface provided in the BIM data processing module in accordance with the present invention.

FIG. 3 is a schematic diagram illustrating a BIM data processing interface provided in the BIM data processing module in accordance with the present invention. The cloud based platform 300 further includes a BIM data processing module which is configured to provide multiple functions, including but not limited to BIM dataset import and viewing, breakdown of basic components, and extraction of BIM information including at least geometric, size, location, material, schedule, conditions, etc. The BIM data processing module is configured to access BIM files written in compliance with standard IFC (Industry Foundation Classes) format and identify and extract information by analyzing IFC schema protocol. The BIM data processing module is configured to break down the entire building into multiple basic components, extract the geometrical information, generate and export robot-fabricatable models consisting of the basic components. The cloud based platform 300 or the BIM data processing module provides application programming interfaces (APIs) and is compatible with the majority of currently available BIM software, such as AUTODESK REVIT™, SKETCHUP™, GRAPHISOFT ARCHICAD™, etc.

Figure 4:
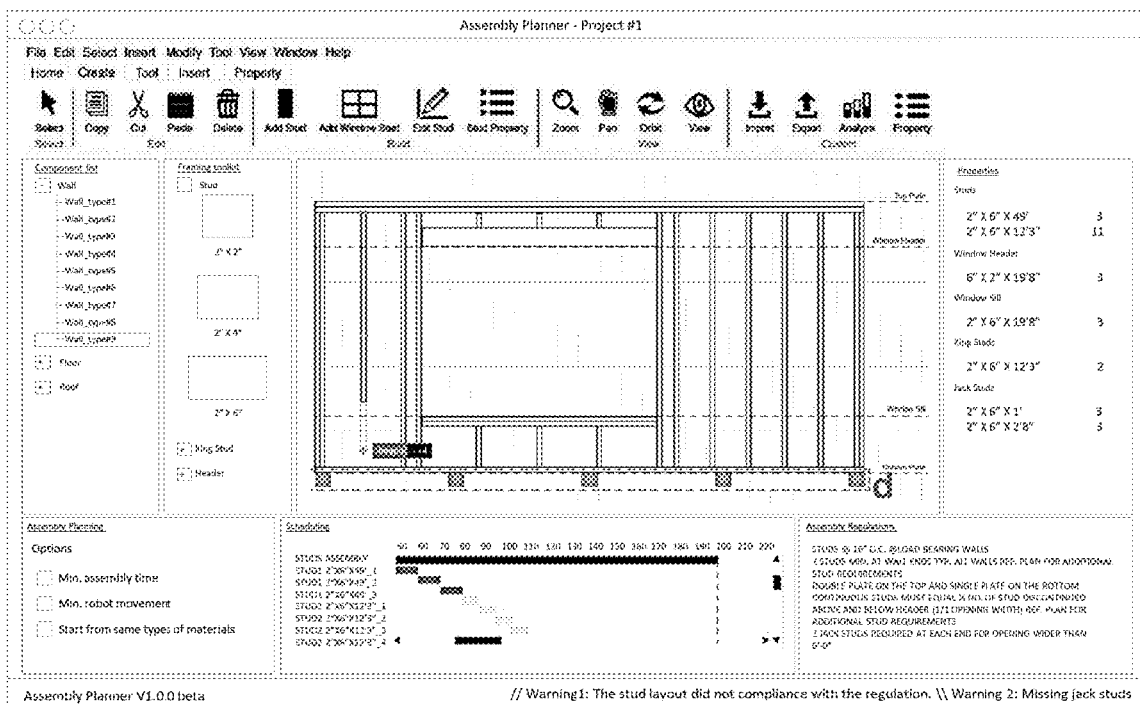
FIG. 4 is a schematic diagram illustrating a component prefabrication planner interface provided in the component prefabrication planner module in accordance with the present invention.

FIG. 4 is a schematic diagram illustrating a component prefabrication planner interface provided in the component prefabrication planner module in accordance with the present invention. The cloud based platform 300 further includes a component prefabrication planner module that is configured to include and run an intelligent optimization algorithm that is capable of automatically computing, arranging and scheduling the optimal manufacturing sequence for fabricating the basic component by taking into account the building regulations, robot capacity, geometric constraints and physical limitations that are extracted from the BIM information, and to autonomously organize and arrange the component prefabrication layout. The component prefabrication planner module is also a construction visualization simulator and includes a visualization user interface that is able to visualize the entire construction processes and show to users.

Figure 5:
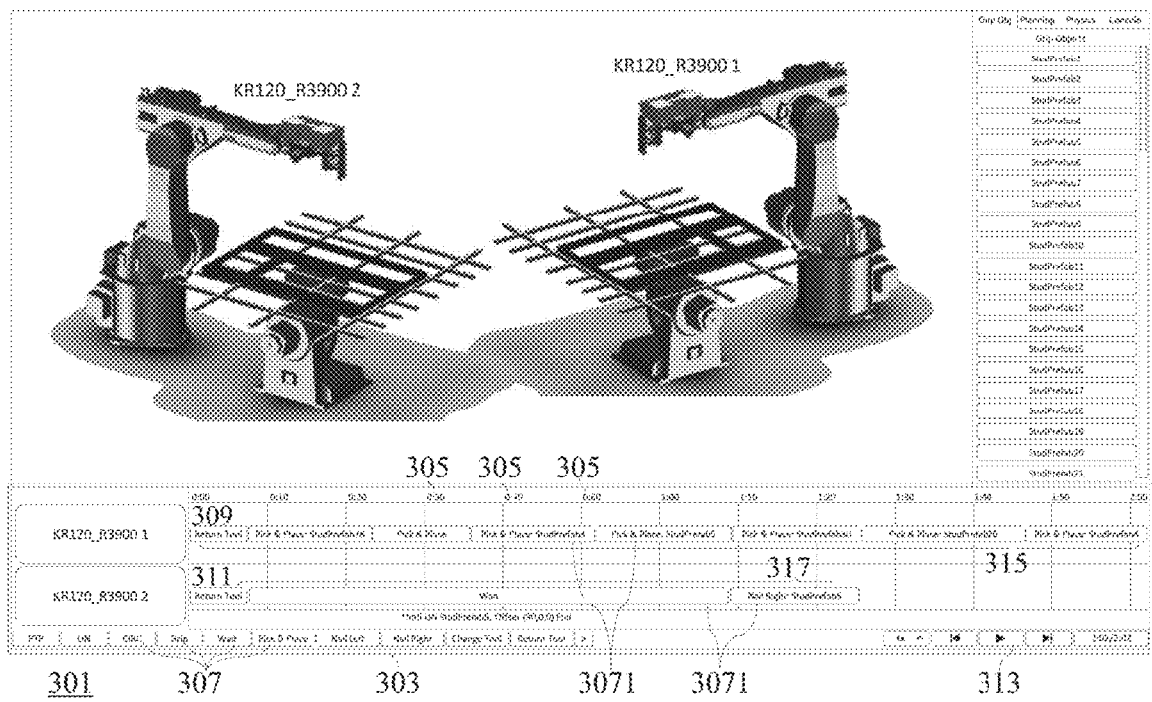
FIG. 5 is a schematic diagram illustrating a robot trajectory simulator interface provided in the robot trajectory simulator module in accordance with the present invention.

FIG. 5 is a schematic diagram illustrating a robot trajectory simulator interface provided in the robot trajectory simulator module in accordance with the present invention. The cloud based platform 300 further includes a robot trajectory simulator module which is configured to provide a trajectory visualization and interactive programming interface 301 showing the detailed visualization for robot trajectories, material arrangement and the layout of the entire working space. The trajectory visualization and interactive programming interface 301 is a visual programming interface and further includes a timeline panel 303 in the lower portion of the interface 301. The timeline panel 303 is provided with multiple time scales 305 displayed at the upper portion of the timeline panel 303, an activation button 313 and a plurality of blocks 307 representing a plurality of robotic basic motions displayed at the lower portion of the timeline panel 303, and two timeline editors 309, 311 displayed at the center portion of the timeline panel 303. A user is allowed to select and pick up multiple selected blocks 3071 out of from the plurality of blocks 307, and to arrange and schedule the selected blocks 3071 in sequence in the respective timeline editors 309, 311 to form two motion combinations 315, 317 in the respective timeline editors 309, 311. Each time when the user manually clicks the activation button 313, a collision check is performed on the motion combination 315, 317 to test whether or not the motion combinations 315, 317 can generate a collision-free robot trajectory. The robot trajectory simulator module is configured to include and run an intelligent robot trajectory algorithm that is capable of automatically computing, arranging, coordinating and scheduling the optimal workflow and trajectories for at least one robot or among multiple robots to fabricate various basic components. Furthermore, the intelligent robot trajectory algorithm is capable of automatically identifying the assembly sequence of basic components and generating collision-free paths or trajectories.

Figure 6:
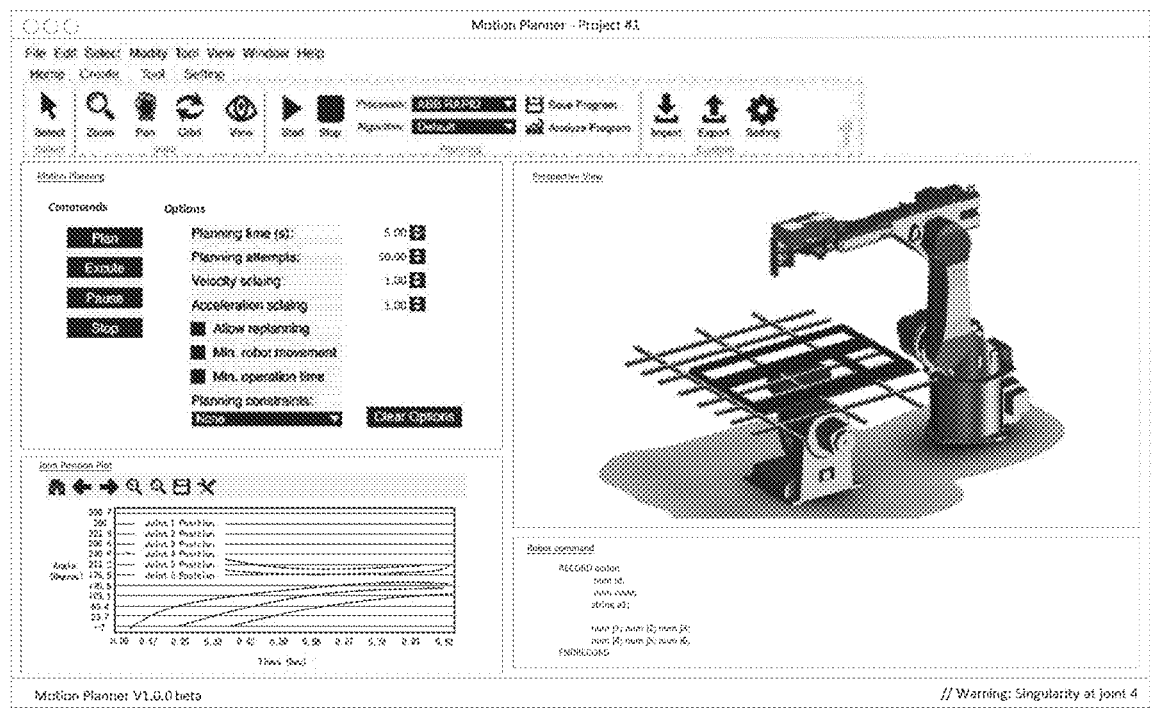
FIG. 6 is a schematic diagram illustrating a robot motion simulator interface provided in the robot motion simulator module in accordance with the present invention.

FIG. 6 is a schematic diagram illustrating a robot motion simulator interface provided in the robot motion simulator module in accordance with the present invention. The cloud based platform 300 further includes a robot motion simulator module which is configured to provide a motion visualization and interactive programming interface showing the detailed visualization for robot motions. The robot motion simulator module is configured to include and run an intelligent robot motion algorithm that is capable of automatically decomposing the robot trajectories into multiple discrete motions, taking into account, for example, constraints of the surroundings and limitations of the robots. The outputs of the robot motion simulator module are fed to the robot controllers of multiple robots 200 contained in the mobile work station 101, to command multiple robots 200 to act accordingly.

The cloud based platform 300 allows the user to select most currently available robot models from major global robot suppliers, such as KUKA™, UNIVERSAL ROBOTS™, ABB™, etc., before performing the robot trajectory and the robot motion simulations. The robot trajectory simulator and robot motion simulator modules are embedded with a built-in physics engine with virtual gravity so as to test and check out the constructability in the virtual environment. The cloud based platform 300 first transforms BIM design into robot control simulation, and then converts the simulations into actual robot motions, to drive actual robots to perform component prefabrication tasks at the near-site position.

Figure 7:
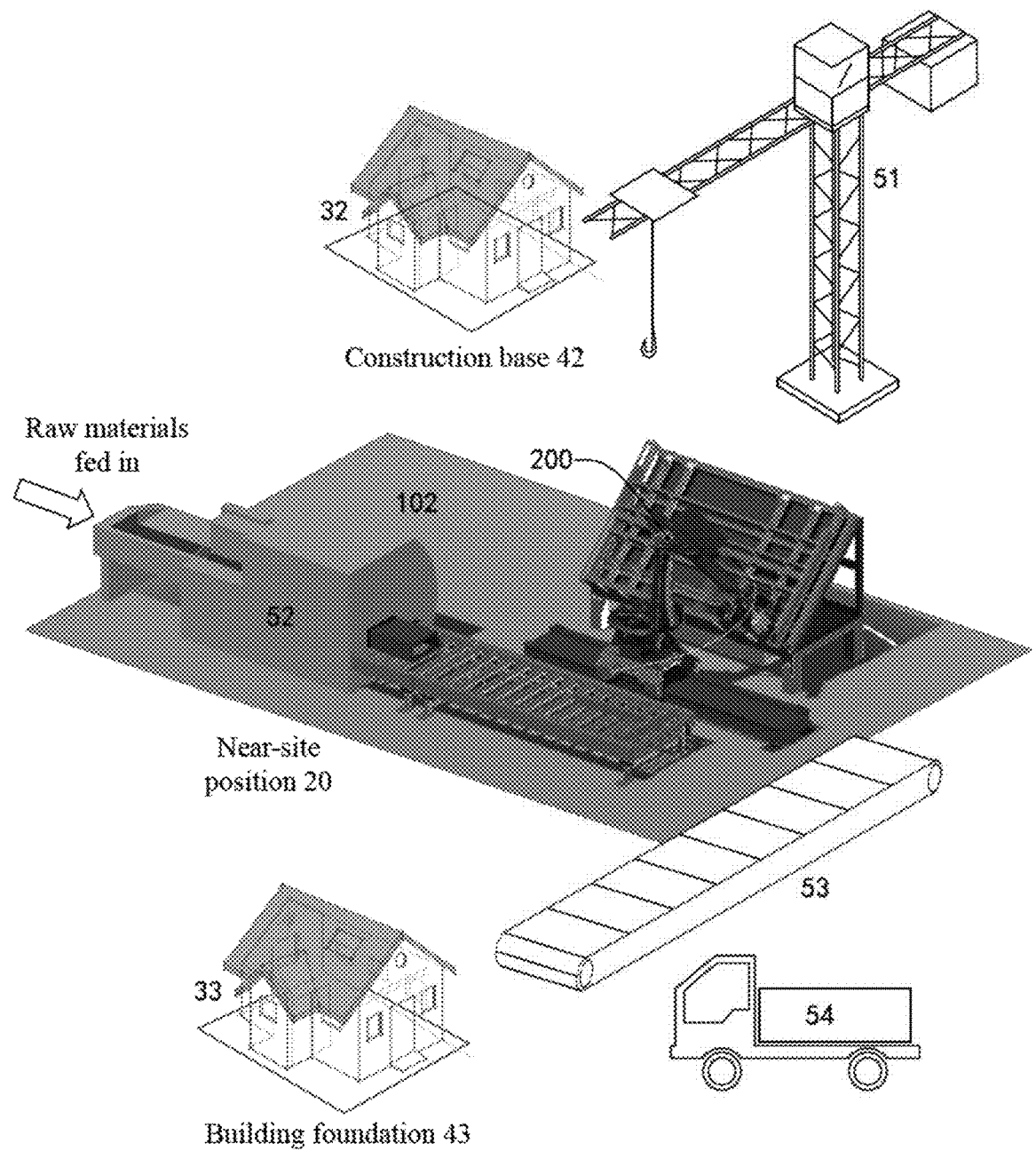
FIG. 7 is a conceptual diagram illustrating the realizations, as well as the second and third embodiments demonstrating a scene of implementation of how the near-site robotic construction system in accordance with the present invention converts a virtual BIM design into an actual robotic component prefabrication construction work performed at the near-site position by an example of wooden house component prefabrication.

FIG. 7 is a conceptual diagram illustrating the realizations, as well as the second and third embodiments demonstrating a scene of implementation of how the near-site robotic construction system in accordance with the present invention converts a virtual BIM design into an actual robotic component prefabrication construction work performed at the near-site position by an example of wooden house component prefabrication. A work station 102 is set up at the near-site position 20, which is close to the construction base 42 and the building foundation 43 on which the wooden houses 32 and 33 are constructed respectively. The work station 102 provides shelter (not shown) and sufficient working space for the installation of the robot 200 to perform the component prefabrication tasks.

The raw materials, such as timbers or logs, are automatically delivered to the robot 200 by, for example, by a roller conveyor 52 that conveys raw materials to the robot 200. The robot 200 is configured to receive the instructions and commands sent from the robot controller and acts accordingly to perform the component prefabrication tasks, to prefabricate the required basic components to assemble the wooden houses 32 and 33. The robot controller receives the output from the cloud based platform 300. In one embodiment, the prefabricated component, for example, a wooden wall panel, is transported to the construction base 42 by, for example, a tower crane 51, to construct the wooden houses 32. In one embodiment, the prefabricated component, for example, a wooden floor panel, is transported to the building foundation 43 by, for example, a conveyor belt 53 or a pickup truck 54, to construct the wooden houses 33.

As compared to the conventional on-site and off-site constructions, the present robotic near-site component prefabrication construction system saves lot of shipping costs, demands less labors, facilitates construction speed about four to five times, enhances overall construction productivity and efficiency dramatically, improves construction site safety, is very suitable for assisting in the construction of unique and special structures with features of high complexity, high mix, and low volume, and is proven to have a high degree of versatility, diversity and flexibility pertaining to performing construction work.

The computer-assisted cloud based near-site robotic construction platform included in the present system is a virtual robotic construction planner or tester or a simulation planner, which significantly cuts down planning costs, time and manpower. Users can easily try and test any construction idea or plan by running the platform without actually activating robots, and invest and spend energy and time on design instead of programming. The platform changes the robotic design cycle and is expected to provide a 70% to 80% improvement in design time.

As the industrial robots' capabilities continue to improve, and costs decrease, the present system is improvable and scalable and promises dramatic improvements in productivity growth. The present system generates step-change improvements in throughput, quality and cost for construction, and creates more efficient and versatile construction logistics. The present system is also termed as a modularized construction system, a construction automation system, a semi-automation construction system, an automated construction system or a robot in the box system.

Figure 8:
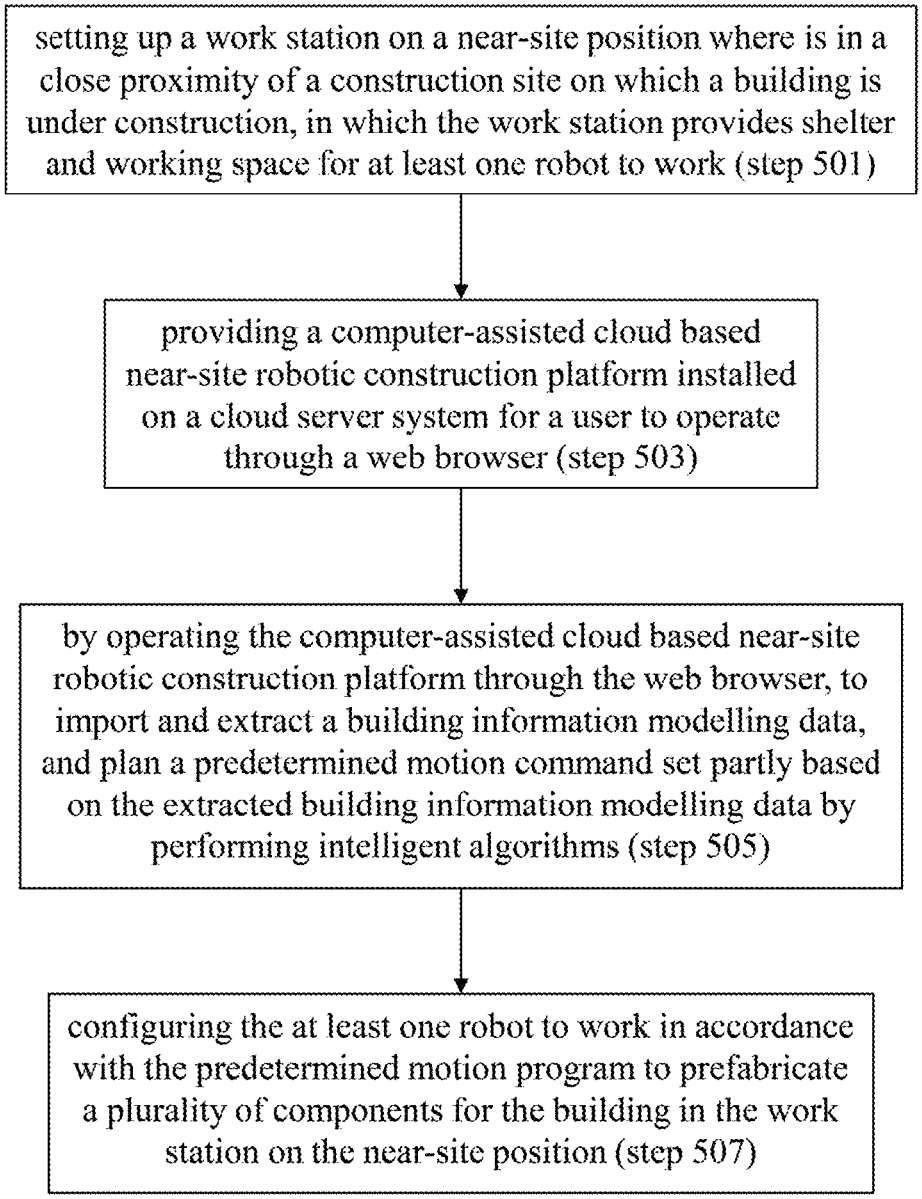
FIG. 8 is a flow chart illustrating the near-site robotic construction method according to the present invention.

FIG. 8 is a flow chart illustrating the near-site robotic construction method according to the present invention. To sum up, the near-site robotic construction method 500 for prefabrication of construction basic components in accordance with the present invention preferably includes the following steps: setting up a work station on a near-site position where is in a close proximity of a construction site on which a building is under construction, in which the work station provides shelter and working space for at least one robot to work (step 501); providing a computer-assisted cloud based near-site robotic construction platform installed on a cloud server system for a user to operate through a web browser (step 503); by operating the computer-assisted cloud based near-site robotic construction platform through the web browser, to import and extract a building information modelling data, and plan a predetermined motion command set partly based on the extracted building information modelling data by performing intelligent algorithms (step 505); and configuring the at least one robot to work in accordance with the predetermined motion command set to prefabricate a plurality of components for the building in the work station on the near-site position (step 507).

The contents in section of written descriptions of the invention disclosed in U.S. Provisional Application No. U.S. 63/007,143, filed on Apr. 8, 2020, now pending, is fully incorporated by reference as follows.

The present invention relates to a robot-based near-site intelligent construction system which includes four major software modules that are selectively merged into an integrated platform, based on the SAAS (Software as a Service), the PAAS (Platform as a Service) and the cloud computation technologies, and accessible and operable through any internet browser by users from a remote end, multiple different sorts of robots and robotics, and other necessary components or devices. The above four major modules are a building information modeling (BIM) extractor module, an assembly planner module, a robot simulator module, and a motion planner module.

The BIM extractor module is designed to break down the entire building into components, extract the geometric information and generate the robot-manufacturable models of the basic component. The assembly planner module includes an intelligent algorithm to generate the optimal manufacturing sequence by taking into account the building regulations, geometric constraints and physical limitations.

The robot simulator module provides the detailed visualization for the robot motions, material arrangement and the layout of the entire working space. These simulations allow optimization of the workflow of robotics manufacturing for each type of basic components. The motion planner module includes the artificial intelligence that automatically breaks down robot trajectories into discrete motions, taking into account both the constraints of surroundings and the limitations of the robots. The output of the motion planner can be connected to the controller of major industrial robots.

The required BIM information required for the construction is first fed into the BIM extractor. All the design work, the construction process, the plan to the construction process, the assembly planning, the motion, path and trajectory planning for robots and robotics required to construct a building are pre-simulated and validated by using the four major software modules, before they are actually reduced to practice. The cloud-based robotics simulator enables the prefabricated home builder to simulate, program, and control the industrial robots, and provides a virtual design and validation environment to link the BIM model with the robot control. It allows the builder to simulate and control the robot with an animation-based tool, instead of writing code.

When the preparation and preprocessing is done, the robots are then packaged and contained in, for example, a container, and shipped to a near-site spot that is in proximity to, preferably very close to, the construction site where the actual construction work will take place. Upon arrival, the robots and robotics are quickly deployed on site and commence performing a prefabrication process to build and assemble the essential components, which are mostly panels, in accordance with the simulation results and the plans made by the modules. The entire intelligent near-site robot-based modular construction system is also termed as a robot builder or a robot in the box.

Further to the above, the method and module includes features as follows: linking the building information model to robot control, off-site manufacturing, on-site facilitation, and building beyond the human workers, etc. A design tool set that ties the BIM design to the robotic prefabrication.

There are further embodiments provided as follows.

Embodiment 1

A near-site robotic construction system includes: a work station situated on a near-site position in a close proximity to a building foundation on which a building is under construction and providing shelter and workspace for at least one robot to work; and a computer-assisted cloud based near-site robotic construction platform installed on a cloud server system and configured to provide for a user to operate through a web browser, import and extract a building information modelling data, and plan a predetermined motion command set partly based on the extracted building information modelling data, wherein the at least one robot is configured to work in accordance with the predetermined motion command set to prefabricate a plurality of components for the building in the work station on the near-site position.

Embodiment 2

The near-site robotic construction system as described in Embodiment 1 further includes one of following elements: a user equipment providing and running the web browser for the user to remotely operate and access the computer-assisted cloud based near-site robotic construction platform on the cloud server system in a remote end to create the predetermined motion command set; controller configured to receive the predetermined motion command set and command and control the at least one robot to act in accordance with the predetermined motion command set; and a transporter configured to move the prefabricated plurality of components to the building.

Embodiment 3

The near-site robotic construction system as described in Embodiment 2, the transporter is selected from one of a roller conveyor, a conveyor belt, a tower crane, a pickup truck, and a powered vehicle.

Embodiment 4

The near-site robotic construction system as described in Embodiment 2, the user equipment is selected from one of a personal computer, a notebook computer, a tablet device, a mobile device, and a smart phone.

Embodiment 5

The near-site robotic construction system as described in Embodiment 1, the computer-assisted cloud based near-site robotic construction platform is established based on the software as a service (SAAS) technology and the platform as a service (PAAS) technology and further includes one of following computer codes: a computer code of a building information modelling data processing module configured to import a building information modelling data pertaining to the building, extract at least one information of a geometric information, a size information, a location information, a material information, a schedule information, and a condition information from the imported building information modelling data, and break down the building into the plurality of components; a computer code of a component prefabrication planner module configured to include a visualization user interface and run an intelligent optimization algorithm capable of computing, arranging and scheduling a fabrication sequence for making the plurality of components in consideration of at least one of factors including a building regulation, a robot capacity, a geometrical constraint and a physics limitation based on the extracted at least one information; a computer code of a robot trajectory simulator module configured to include a trajectory visualization and interactive programming interface and run intelligent robot trajectory algorithm capable of computing, arranging, coordinating and scheduling the optimum workflow to establish at least one robot trajectory included in the predetermined motion command set for the at least one robot to perform based on the fabrication sequence; and a computer code of a robot motion simulator module configured to include a motion visualization and interactive programming interface and run intelligent robot motion algorithm capable of decomposing the established at least one robot trajectory into multiple discrete robot motions included in the predetermined motion command set.

Embodiment 6

The near-site robotic construction system as described in Embodiment 1, the building is constructed by implementing civil engineering based construction works and selected from one of a house, a wooden house, a reinforced concrete building, a steel building, a steel-reinforced concrete building, a residential complex, an apartment complex, a ondominium, a dwelling unit, a skyscraper, and a combination thereof.

Embodiment 7

A near-site robotic construction system includes: a mobile work station containing and carrying at least one robot to a near-site position in a close proximity to a construction base where a building is under construction; and a computer-assisted cloud based near-site robotic construction platform configured to provide for a user to operate through a web browser, import and extract a building information modelling data, and plan a predetermined motion command set partly based on the extracted building information modelling data, wherein the at least one robot is configured to work in accordance with the predetermined motion command set to prefabricate a plurality of components for the building in the mobile work station on the near-site position.

Embodiment 8

The near-site robotic construction system as described in Embodiment 7, the mobile work station is selected from one of a container, a container truck, a cargo truck, a container installed on and carried by a mobile chassis, a container towed by a powered vehicle.

Embodiment 9

A near-site robotic construction method includes: setting up a work station on a near-site position where is in a close proximity to a construction site on which a building is under construction, in which the work station provides shelter and workspace for at least one robot to work; providing a computer-assisted cloud based near-site robotic construction platform installed on a cloud server system for a user to operate through a web browser; by operating the computer-assisted cloud based near-site robotic construction platform through the web browser, to import and extract a building information modelling data, and plan a predetermined motion command set partly based on the extracted building information modelling data; and configuring the at least one robot to work in accordance with the predetermined motion command set to prefabricate a plurality of components for the building in the work station on the near-site position.

Embodiment 10

The near-site robotic construction method as described in Embodiment 9 further includes one of following steps: providing a computer code of a building information modelling data processing module configured to import a building information modelling data pertaining to the building, extract at least one information of a geometric information, a size information, a location information, a material information, a schedule information, and a condition information from the imported building information modelling data, and break down the building into the plurality of components; providing a computer code of a component prefabrication planner module configured to include a visualization user interface and run an intelligent optimization algorithm capable of computing, arranging and scheduling a fabrication sequence for making the plurality of components in consideration of at least one of factors including a building regulation, a robot capacity, a geometrical constraint and a physics limitation based on the extracted at least one information; providing a computer code of a robot trajectory simulator module configured to include a trajectory visualization and interactive programming interface and run intelligent robot trajectory algorithm capable of computing, arranging, coordinating and scheduling the optimum workflow to establish at least one robot trajectory included in the predetermined motion command set for the at least one robot to perform based on the fabrication sequence; and providing a computer code of a robot motion simulator module configured to include a motion visualization and interactive programming interface and run intelligent robot motion algorithm capable of decomposing the established at least one robot trajectory into multiple discrete robot motions included in the predetermined motion command set.

While the disclosure has been described in terms of what are presently considered to be the most practical and preferred embodiments, it is to be understood that the disclosure need not be limited to the disclosed embodiments. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present disclosure which is defined by the appended claims.

What is claimed is:

1. A near-site robotic construction system, comprising:
a work station situated on a near-site position in a close proximity to a building foundation on which a building is under construction and providing shelter and workspace for at least one robot to work; and
a computer-assisted cloud based near-site robotic construction platform installed on a cloud server system and configured to provide for a user to operate the computer-assisted cloud based near-site robotic construction platform through a web browser, import a building information modelling data, and plan a motion command set comprising a motion path and a sequence of motions partly based on the imported building information modelling data by performing intelligent algorithms,
wherein the at least one robot is configured to work in accordance with the motion command set to prefabricate a plurality of components for the building in the work station on the near-site position,
wherein the computer-assisted cloud based near-site robotic construction platform further comprises a robot trajectory simulator module and a robot motion simulator module,
wherein the robot trajectory simulator module is configured to:
provide a trajectory visualization and interactive programming interface showing a visualization for a plurality of robot trajectories, a material arrangement and a layout of a working space of the at least one robot in the work station, wherein the trajectory visualization and interactive programming interface is further configured to:
perform a collision check to automatically generate a motion combination including a plurality of robotic basic motions with a plurality of collision-free robot trajectories or provide for the user to manually generate the plurality of collision-free robot trajectories by manually performing a trial-and-error test including arranging or adjusting sequences of a plurality of blocks representing the plurality of robotic basic motions to form the motion combination, manually activating the collision check by clicking an activation button, and using the motion combination passing the collision check, wherein the plurality of blocks and the activation button are shown in the trajectory visualization and interactive programming interface; and
automatically compute, arrange, coordinate and schedule a workflow for the plurality of robotic basic motions with the manually-generated plurality of collision-free robot trajectories for the at least one robot among a plurality of robots to fabricate the plurality of components,
wherein the robot motion simulator module is configured to:
provide a motion visualization and interactive programming interface showing the visualization for robot motions that form the motion command set and are established in accordance with the generated plurality of robotic basic motions with the manually-generated plurality of collision-free robot trajectories.

2. The near-site robotic construction system as claimed in claim 1, further comprising one of:
a user equipment providing and running the web browser for the user to remotely operate and access the computer-assisted cloud based near-site robotic construction platform on the cloud server system remotely to create the motion command set;
a controller configured to receive the motion command set and command and control the at least one robot to act in accordance with the motion command set; and
a transporter configured to move the prefabricated plurality of components to the building.

3. The near-site robotic construction system as claimed in claim 2, wherein the transporter is selected from one of a roller conveyor, a conveyor belt, a tower crane, a pickup truck, and a powered vehicle.

4. The near-site robotic construction system as claimed in claim 2, wherein the user equipment is selected from one of a personal computer, a notebook computer, a tablet device, a mobile device, and a smart phone.

5. The near-site robotic construction system as claimed in claim 1, wherein the computer-assisted cloud based near-site robotic construction platform is established based on the platform as a service (PAAS) technology and further comprises one of following computer codes:
a computer code of a building information modelling data processing module configured to import a building information modelling (BIM) data pertaining to the building that is under construction, acquire at least one building related information of a geometric information, a size information, a location information, a material information, a schedule information, and a condition information from the imported building information modelling data, and break down the building into the plurality of components;
a computer code of a component prefabrication planner module configured to comprise a visualization user interface and run an intelligent algorithm capable of computing, arranging and scheduling a fabrication sequence for making the plurality of components in consideration of at least one of factors including at least one component related information of a building regulation, a robot capacity, a geometrical constraint and a physics limitation acquired from the imported building information modelling data;
a computer code of the robot trajectory simulator module configured to comprise the trajectory visualization and interactive programming interface and run an intelligent robot trajectory algorithm capable of computing, arranging, coordinating and scheduling the workflow to establish at least one robot trajectory comprised in the motion command set for the at least one robot to perform based on the fabrication sequence; and a computer code of the robot motion simulator module configured to comprise the motion visualization and interactive programming interface and run an intelligent robot motion algorithm capable of decomposing at least one robot trajectory into multiple discrete robot motions comprised in the motion command set.

6. The near-site robotic construction system as claimed in claim 1, wherein the building is selected from one of a house, a wooden house, a reinforced concrete building, a steel building, a steel-reinforced concrete building, a residential complex, an apartment complex, a condominium, a dwelling unit, a skyscraper, and a combination thereof.

7. A near-site robotic construction system, comprising:

a mobile work station containing and carrying at least one robot to a near-site position in a close proximity to a construction base where a building is under construction; and a computer-assisted cloud based near-site robotic construction platform configured to provide for a user to operate the computer-assisted cloud based near-site robotic construction platform through a web browser, import a building information modelling data, and plan a motion command set comprising a motion path and a sequence of motions partly based on the imported building information modelling data by performing intelligent algorithms, wherein the at least one robot is configured to work in accordance with the motion command set to prefabricate a plurality of components for the building in the mobile work station on the near-site position, wherein the computer-assisted cloud based near-site robotic construction platform further comprises a robot trajectory simulator module and a robot motion simulator module, wherein the robot trajectory simulator module is configured to:

provide a trajectory visualization and interactive programming interface showing a visualization for a plurality of robot trajectories, a material arrangement and a layout of a working space of the at least one robot in the mobile work station, wherein the trajectory visualization and interactive programming interface is further configured to:

perform a collision check to automatically generate a motion combination including a plurality of robotic basic motions with a plurality of collision-free robot trajectories or provide for the user to manually generate the plurality of collision-free robot trajectories by manually performing a trial-and-error test including arranging or adjusting sequences of a plurality of blocks representing the plurality of robotic basic motions to form the motion combination, manually activating the collision check by clicking an activation button, and using the motion combination passing the collision check, wherein the plurality of blocks and the activation button are shown in the trajectory visualization and interactive programming interface; and automatically compute, arrange, coordinate and schedule a workflow for the plurality of robotic basic motions with the manually-generated plurality of collision-free robot trajectories for the at least one robot among a plurality of robots to fabricate the plurality of components, wherein the robot motion simulator module is configured to:

provide a motion visualization and interactive programming interface showing the visualization for robot motions that form the motion command set and are established in accordance with the generated plurality of robotic basic motions with the manually-generated plurality of collision-free robot trajectories.

8. The near-site robotic construction system as claimed in claim 7, wherein the mobile work station is selected from one of a container, a container truck, a cargo truck, a container installed on and carried by a mobile chassis and a container towed by a powered vehicle.

* * * * *